United States Patent [19]

Pedersen et al.

[11] 4,001,489

[45] Jan. 4, 1977

[54] SUBMARINE POWER CABLE GROUNDING MEANS AND METHOD

[75] Inventors: Jack Raymond Pedersen, Ekholt; Lars Arthur Aanerud, Strommen, both of Norway

[73] Assignee: International Standard Electric Corporation, New York, N.Y.

[22] Filed: Dec. 8, 1975

[21] Appl. No.: 638,239

[30] Foreign Application Priority Data

Dec. 17, 1974 Norway .............................. 4544/74

[52] U.S. Cl. .................................. 174/10; 29/624; 174/6; 174/106 R; 174/108

[51] Int. Cl.$^{2}$ ...................... H01B 7/14; H01B 9/02; H05K 3/00

[58] Field of Search ................ 174/10, 6, 36, 72 R, 174/106 R, 105 R, 102 R, 108, 115; 29/624

[56] References Cited

UNITED STATES PATENTS

| | | | |
|---|---|---|---|
| 3,553,341 | 1/1971 | Hureau | 174/6 |
| 3,662,090 | 5/1972 | Grey | 174/102 R |
| 3,725,564 | 4/1973 | Wiedman et al. | 174/6 |
| 3,778,531 | 12/1973 | Higgins | 174/72 R |
| 3,801,729 | 4/1974 | Portinari et al. | 174/106 R |

FOREIGN PATENTS OR APPLICATIONS

| | | | |
|---|---|---|---|
| 508,236 | 9/1930 | Germany | 174/106 R |
| 349,415 | 5/1931 | United Kingdom | 174/106 R |

*Primary Examiner*—Arthur T. Grimley
*Attorney, Agent, or Firm*—John T. O'Halloran; Thomas M. Marshall

[57] ABSTRACT

A method and means for grounding the conductive layer of a long power cable is provided wherein at least one metal wire is provided which is connected on one end to the metal sheath prior to the application of an insulation sheath. The outer portion of the metal wire is pulled through an opening made at a predetermined place at the insulation sheath whereupon the hole in the insulation is sealed immediately. Thereafter the metal wire is electrically interconnected to the armor sheath either during or after the application of the armoring sheath layers.

13 Claims, 5 Drawing Figures

SUBMARINE POWER CABLE GROUNDING MEANS AND METHOD

BACKGROUND OF THE INVENTION

1. Field of the Invention

Grounded submarine electric power cables.

2. Description of the Prior Art

Normally, electric power cables are manufactured in relatively short lengths with a conductive sheath of lead or aluminum provided which is grounded at each cable joint. The grounding is necessary in order to prevent excessive current and voltage build up in the metal sheath. When long submarine power cables are manufactured they are usually made in one piece, thus it is necessary to ensure that the metal sheath is grounded either continuously or at specified intervals.

The problem which is encountered in obtaining the desired grounding concerns the penetration of the corrosion protective insulating plastic sheath which covers the metal sheath. One of the methods and means used in the prior art is described in U.S. Pat. No. 3,810,729. That patent describes conventional penetration methods and their drawbacks. The teaching of the prior art patent is to use a screw and nut device with the nut part secured to the metal sheath or to a frettage applied over the metal sheath. The device includes a C-shaped clamping element mounted on the frettage and covered by an insulating sheath except for a small hole over a threaded hole in the clamping element which includes a threaded element extending through the sheath hole and into the threaded hole of the clamping element. The threaded element may have arms or spokes to assist in screwing it into place. The threaded element is covered by and in contact with the surrounding armor. Clamping elements are applied to the frettage prior to the extrusion of the insulating sheath thereover and holes are successively punched into the sheath over the threaded hole in the clamping element. Then the threaded elements are successively inserted and thereafter the armor is applied. The hole made in the plastic sheath is said to be sealed by squeezing the plastic sheath between the nut and screw.

It is very unlikely that the described means and method for grounding the metal sheath will work satisfactorily in practice since the cable is coiled, bent and unbent many times during the installation. The stiff mechanical connection is likely to be easily damaged or broken and the hole through the plastic sheath may easily be torn or stretched with the result that the sealing may be impaired.

In U.S. Pat. No. 3,801,729, a conventional method employing a single conductive element having a dimension of sufficient height to extend through the thickness of the insulating sheath is described which comes into contact with the armor. This patent recognized that such a means and method has the drawback of removing and subsequently reconstructing portions of the sheath at each place where the grounding device is provided.

SUMMARY OF THE INVENTION

In the present invention, an electrical interconnection is made between the metal sheath and the armor layer by first electrically interconnecting one or more metallic conductors to the metal sheath prior to the application of the insulation sheath. The metal wire conductors attached to the sheath are provided at each location along the power cable where grounding is desired. After the insulation sheath has been applied over the metal sheath and the metal wires attached to the metal sheath a hole is made in the insulation immediately above a portion of the metal wire. Thereafter, substantially the whole length of the metal wire is pulled through the hole the desired amount and the hole in the insulation is sealed. Thereafter, the metal grounding wire is electrically connected to the metal armoring sheath during or after the application of the armoring layers. Thus grounding between the metal sheath and the metal armoring layers is provided which is very flexible and the point at which the grounding wire penetrates the insulating layer is effectively sealed.

An additional feature of the method and means of this invention is that, after application to the metal sheath, the entire length of the metal wire or wires is arranged flat against the outer surface of the metal sheath in a flat helix with its inner end only electrically connected to the metal sheath. The only penetration in the insulation sheath is a hole of sufficient size to permit the outer end of the metal grounding wire or wires to pass therethrough. After the desired length of the grounding wire or wires has been withdrawn, the hole is effectively sealed and the outer portion of the grounding wire or wires is electrically connected to the armoring layer or layers either during their application or thereafter.

In the further embodiment of the invention, the free end of the grounding wire or wires have attached thereto a permanent magnet in order to facilitate the location of the free end beneath the insulation sheath and thus clearly identify the point at which penetration of the insulation sheath to obtain access to the free end can be made.

DESCRIPTION OF THE PREFERRED EMBODIMENTS

Figure 1:
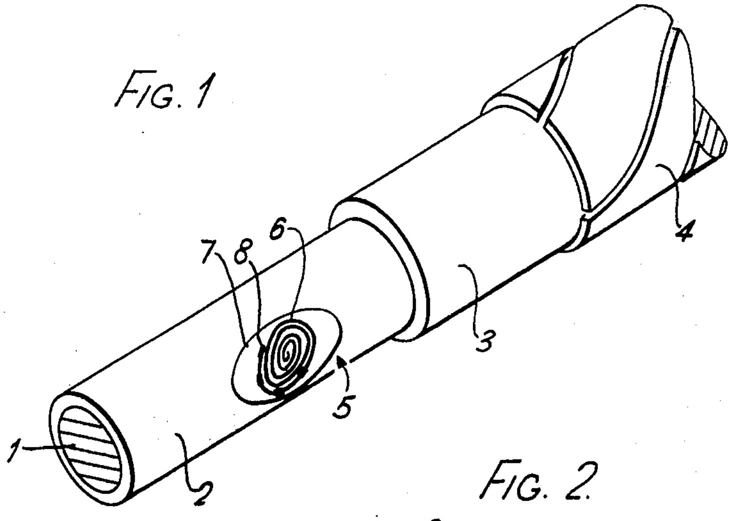
FIG. 1 is a perspective view of a power cable with the electrical grounding conductor device in place on the metal sheath.

In FIG. 1, there is illustrated an electrical power cable suitable for submarine use, and other use, which has a cable core 1 surrounded by a metal sheath 2 which may be lead or aluminum or a similar electrically conducting metal; an insulation sheath 3 and a metallic armoring layer or layers 4.

The metal sheath 2 may preferably be a continuous lead or aluminum sheath which may have over it one or more layers of metallic tape.

It should also be understood that in the cable illustrated in FIG. 1 there may be other layers of insulating, semiconducting and conducting tapes including additional layers of armoring 4 and corrosion protective layer for the armoring layer or layers 4.

In FIG. 1, the grounding conductor device generally indicated at 5 comprises a wire or wires 6 coiled flat on a metal plate 7. The wire or wires 6 are electrically connected to the metal plate 7 at its outer end 8. The metal plate 7 may constitute a thin pliable copper plate shaped so as to have no sharp edges. The plate 7 may be soldered or welded to the metal sheath 2 or it may be so shaped as to be formed around and in electrical contact with the sheath 2. It should be understood that if there are metal tapes covering the metal sheath 2 that the plate 7 may be soldered thereto or formed therearound. The grounding conductor device 5 is placed on and electrically connected to the metal sheet 2 immediately prior to the extrusion of the insulation layer 3. In order to make sure that the conductor device 5 remains flat against the surface of the metal sheath 2 so as not to interfere with the plastic extrusion process. It may be considered advantageous to cover the conductor device 5 with several layers of tape wound around the cable.

It should be further understood that the metal plate 7 may be omitted. In that instance the wire or wires 6 should be electrically connected directly at their outer ends 8 to the metal sheath 2. It is better to use the metal plate 7 since the metal plate 7 represents a protection against accidental cutting of the metal sheath in the subsequent steps described below.

The plastic sheet 3 is extruded over the metallic sheath 2 and covers the conductor device 5 completely. After the extrusion of the plastic sheath 3, the conductor device 5 is located and a small hole is cut through the insulating plastic sheath layer 3 which is just large enought to permit the inner unattached ends of the wire or wires 6. It is preferable to cut a small plug out of the plastic sheath 3 at the location of the center of the coiled wire or wires 6 immediately adjacent the free end of the conductor device 5.

Figure 2:
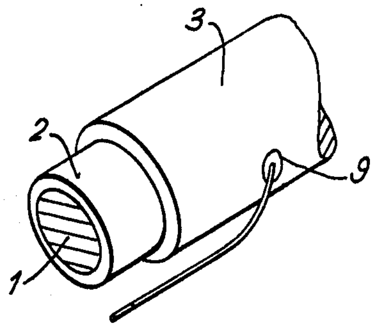
FIG. 2 shows the grounding conductor device pulled through a hole in the insulating sheath.

As is illustrated in FIG. 2, the free end of the wire or wires 6 is pulled out through the hole in the plastic sheath 3. The insulation layer 3 may be transparent in order to facilitate the location of the inner end of the wire or wires 6. It is important that the hole 9 in the plastic sheath 3 be made at approximately the center of the wire coil so that the wire 6 may be pulled easily through the hole 9. Substantially the entire length of the wire or wires 6 are pulled through the hole, however, one or two turns of the wire or wires 6 should be left below the plastic sheath 3 in order to allow for relative movement between the metal sheath 2 and the insulating plastic sheath 3.

Once the desired length of wire 6 has been pulled through hole 9, hole 9 is sealed by replacing the plug and sealing the opening 9 with asphalt or some other suitable sealing compound. In addition, the hole 9 and the area surrounding the portion of wire or wires 6 therein may also be sealed with insulating tape.

It should be understood that the wire or wires 6 may be and advantageously should be insulated. The insulation for wire or wires 6 is preferably of the same material as the material used in the insulating plastic sheath 3 to facilitate safe sealing of the hole 9. It is also advisable in the case of an insulated wire or wires 6 that such insulation have a sealing compound within the insulation to prevent moisture or humidity absorption.

Figure 3:
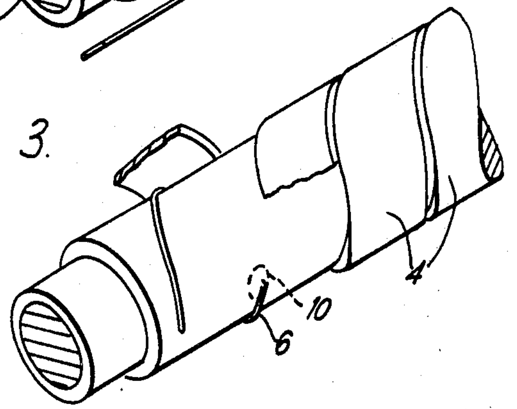
FIG. 3 shows the position of the parts after the step illustrated in FIG. 2 and after the hole in the insulating sheath has been sealed and shows the application of armoring layers.

In FIG. 3, the process has reached the step where the hole 9 has been sealed as indicated by the broken circle 10 and the wire or wires 6 have been wound around the exterior of the plastic sheath 3 in the same direction as the armoring tapes 4 are being wound. The wire or wires 6 may be soldered to the underside of one of the armor tapes prior to the winding of the armoring tapes 4 over the sealed hole 10. Alternatively, the wire or wires 6 may be brought to the outer surface of the armoring tapes 4 and be soldered or welded to the tape 4. It is also possible that instead of the connecting the wire or wires 6 directly to the tape 4, that the wire or wires 6 may be connected to a metal plate or the like which in turn is electrically connected to the armoring tapes 4. It should be understood that the armoring tapes 4 could be replaced by metal wires.

Under normal conditions the armoring layer 4 will be provided with corrosion protective layers (not shown).

Figure 4:
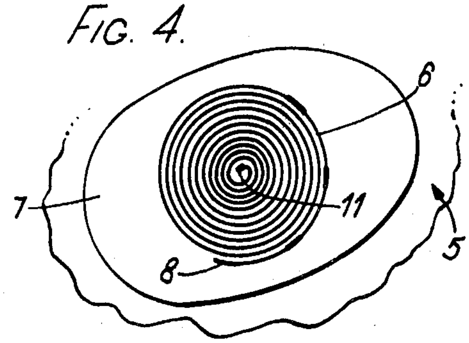
FIG. 4 shows one embodiment of the grounding conductor device of this invention.

In FIG. 4, the embodiment of the connecting conductor device 5 comprises a metal plate 7, and a wire or wires 6 (preferably an annealed steel wire or other non-elastic metal electrically conducting wire) which is coiled flat on the plate 7. The coil of wire or wires 6 is soldered or otherwise electrically connected at one or more places indicated at 8 along its outer periphery. The inner end of the wires or wires 6 has attached thereto a small permanent magnet 11. Once the plastic sheath 3 has been extruded over the embodiment illustrated in FIG. 4, the location of the inner end of wire or wires 6 may be determined by using iron particles on the outer surface of the insulating plastic sheath 3. The iron particles will adhere to the insulating plastic sheath layer 3 at the precise location of the permanent magnet 11 thus indicating the precise point at which a hole 9 should be made through plastic sheath 3.

It should be understood that the conductor device 5 of this invention may include wire or wires 6 consisting of two or more parallel wires in order to ensure grounding of the metal sheath 2 should one of the wires 6 be broken. It should also be understood that the wires instead of being parallel may be twisted together.

Figure 5:
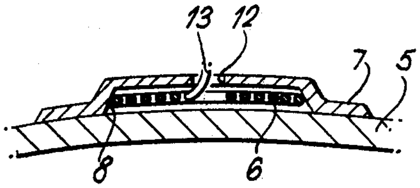
FIG. 5 shows an alternate embodiment of the conductor device of this invention.

A further embodiment is illustrated in FIG. 5 in which the metal plate 7 is formed in an inverted disc shape to provide a space for the coiled wire or wires 6. As before, the outer periphery and thus the outer end of the coil of wire or wires 6 is soldered or otherwise electrically connected to the plate 7 and the plate 7 is electrically connected to the metal sheath 2.

A centrally arranged aperture 12 through the metal plate 7 is provided through which the end of the wire or wires 6 may be pulled out. The inner end 13 of the coil of wire or wires 6 is preferably preformed so that it has a tendency to protrude out through the aperture 12. This facilitates the location of the position of the inner end 13 of the wire or wires 6 when a hole 9 is cut through the insulating plastic sheath layer 3.

While certain specific embodiments have been shown and others have been described, it is to be understood that other means and methods may be employed which do not depart from the scope of the appended claims.

What is claimed is:

1. A method of forming an electrical cable having a conducting core surrounded by a metal sheath, an insulation layer and an armoring layer and having an electrical interconnection between said metal sheath and said armoring including the steps of:

positioning a grounding conductor device at predetermined positions of said metal sheath prior to the application of said insulating sheath, said grounding conductor device comprising at least one metal wire;

electrically connecting one end of said metal wire to said metal sheath prior to application of an insulating sheath over said metal sheath and said conductor device;

forming openings in said insulating sheath at each of the predetermined locations of said conductor device;

pulling substantially the entire length of said wire through said hole in said insulating sheath;

sealing said hole;

providing an armoring layer about and along said insulating sheath; and electrically interconnecting said conductor device to said armoring.

2. The method according to claim 1, wherein said electrical interconnection between said metal sheath and said armoring is performed during the application of said armoring layers.

3. The method according to claim 1 wherein said electrical connection between said metal sheath and said armoring layers is performed after the application of said armoring layer.

4. The method according to claim 1 wherein said conductor device comprises a metal wire the entire length of which is arranged prior to the application of said insulating sheath so as to lie flat against the outer surface of said metal sheath.

5. The method according to claim 4 wherein said metal wire is formed into a flat helix on the surface of said metal sheath prior to the application of said insulating sheath and said holes through said insulation sheath are formed to correspond to the free end of said metal wire to facilitate pulling said wire through said hole in said insulating sheath.

6. The method according to claim 1 including the further step of attaching a small permanent magnet to the end of said metal wire which is not electrically connected to said grounding sheath prior to the application of said insulating sheath to facilitate the determination of the position of said holes through said insulation sheath.

7. The method of claim 1 wherein said grounding conductor device is formed by electrically connecting a metal plate to said metal sheath, electrically connecting the outer periphery of said metal wire to said metal plate.

8. The method in accordance with claim 1 wherein said grounding electric conductor device comprises an inverted flat dish shaped plate, having a central aperture formed therethrough and at least one conducting metal wire including the steps of:

electrically connecting one end of said metal wire to the interior portion of said dished metal plate;

forming the free end of said wire so as to protrude through said opening in said plate; and electrically connecting at least the periphery of said plate to said metal sheath.

9. A method according to claim 1 including the further step of insulating said metal wire with the same material as is utilized to form said insulating sheath and sealing said insulated wire to said insulating sheath in each position of said holes.

10. The method of claim 9 including the further step of applying a sealing compound to said metal wire between its insulating layer and said metal wire.

11. A power cable having a core surrounded by at least one layer forming a metallic sheath for said core and at least one layer of insulating material surrounding said metal sheath and at least one armoring layer around said insulated layer and means for electrically interconnecting said metal sheath and said armoring layer comprising: electrically conductive grounding means consisting of at least one metal wire electrically connected to said metal sheath prior to the application of said insulating layer, said metal wire leading from said metal sheath through a sealed hole formed in said insulating layer and electrically connected to said armoring layer.

12. The power cable of claim 11 wherein said grounding device consists of a flat plate electrically connected to said metal sheath having electrically attached thereto one end of said metal wire, the other end of said metal wire passing through a sealed hole in said insulating layer and electrically connected to said armoring layer.

13. The power cable of claim 11 wherein said grounding device consists of an inverted dished-shaped electrically conducting plate electrically connected to said metal sheath at its periphery, said metal wire being positioned in the interior of said dished shaped plate having at least one end electrically attached to the interior of said plate, and the other end of said metal wire passes through both a centrally formed aperture in said dished plate and a sealed hole in said insulating layer and is electrically connected to said armoring layer.

* * * * *